(12) United States Patent
Yamazaki et al.

(10) Patent No.: US 9,322,954 B2
(45) Date of Patent: Apr. 26, 2016

(54) FLUORITE PRODUCTION METHOD

(75) Inventors: Takafumi Yamazaki, Ageo (JP); Yusuke Shiro, Ageo (JP); Masao Sekiguchi, Ageo (JP)

(73) Assignee: Nihon Kessho Kogaku Co., Ltd., Tatebayashi (JP)

( * ) Notice: Subject to any disclaimer, the term of this patent is extended or adjusted under 35 U.S.C. 154(b) by 94 days.

(21) Appl. No.: 13/811,357

(22) PCT Filed: Jun. 30, 2011

(86) PCT No.: PCT/JP2011/065026
§ 371 (c)(1),
(2), (4) Date: Jan. 21, 2013

(87) PCT Pub. No.: WO2012/011373
PCT Pub. Date: Jan. 26, 2012

(65) Prior Publication Data
US 2013/0115158 A1    May 9, 2013

(30) Foreign Application Priority Data

Jul. 22, 2010    (JP) ................................ 2010-164808

(51) Int. Cl.
| | | |
|---|---|---|
| C01D 3/02 | (2006.01) | |
| G02B 1/02 | (2006.01) | |
| C30B 11/00 | (2006.01) | |
| C30B 29/12 | (2006.01) | |
| C30B 33/02 | (2006.01) | |

(52) U.S. Cl.
CPC . *G02B 1/02* (2013.01); *C30B 11/00* (2013.01); *C30B 29/12* (2013.01); *C30B 33/02* (2013.01)

(58) Field of Classification Search
None
See application file for complete search history.

(56) References Cited

U.S. PATENT DOCUMENTS

| | | | |
|---|---|---|---|
| 7,105,049 | B2 | 9/2006 | Sakai |
| 7,204,942 | B2 * | 4/2007 | Mayolet et al. .............. 264/1.23 |
| 7,651,861 | B2 * | 1/2010 | Ookubo ................. C30B 11/00 117/11 |
| 7,754,011 | B2 | 7/2010 | Sakai |
| 2001/0025598 | A1 | 10/2001 | Staeblein et al. |
| 2002/0162501 | A1 * | 11/2002 | Kuwabara ....................... 117/81 |
| 2004/0099205 | A1 * | 5/2004 | Li et al. ............................ 117/2 |
| 2005/0139147 | A1 * | 6/2005 | Wang ................................ 117/3 |

FOREIGN PATENT DOCUMENTS

| | | |
|---|---|---|
| JP | 63218600 A | 9/1988 |
| JP | 11116400 A | 4/1999 |
| JP | 2001335398 A | 12/2001 |
| JP | 2002037697 A | 2/2002 |
| JP | 2003-081700 A | 3/2003 |
| JP | 2003238293 A | 8/2003 |
| JP | 2004099409 A | 4/2004 |
| JP | 2004-196605 A | 7/2004 |
| JP | 2005015291 A | 1/2005 |
| JP | 2006342029 A | 12/2006 |
| JP | 2008156165 A | 7/2008 |

* cited by examiner

Primary Examiner — Jonathan Johnson
Assistant Examiner — Anita Nassiri Motlagh
(74) Attorney, Agent, or Firm — The Webb Law Firm

(57) ABSTRACT

A fluorite with excellent laser durability is provided by devising a heat-treatment method for $CaF_2$ crystal. A fluorite production method is proposed, wherein heat-treatment is carried out by providing, through compartment walls in the periphery of a fluorite crystal, a fluoride gas trap layer containing a fluoride gas-adsorbing material.

8 Claims, 10 Drawing Sheets

FLUORITE PRODUCTION METHOD

TECHNICAL FIELD

The present invention relates to a production method for a fluorite ($CaF_2$, calcium fluoride) that can be used, for instance, as an optical lens and a lens material used in semiconductor lithography or the like.

TECHNICAL BACKGROUND

Having special partial dispersion characteristics (: anomalous partial dispersion; Abbe number: 95) in addition to having extremely small chromatic dispersion, low refractive index and dispersion ratio compared to generic optical glasses, crystals of fluorite ($CaF_2$ crystals) are used broadly in apochromatic lenses (apochromats), window plates of infrared analyzers, excimer lasers and the like, TV camera lenses and microscope lenses, lenses of semiconductor lithography (including steppers, scanners and the like) devices, which are devices for transferring microscopic patterns onto wafers, and the like.

Among them, regarding steppers (reduction projection-type exposure devices), which assume the miniaturization process in semiconductor lithography devices, shortening of the light source wavelength has been proceeding in order to raise the resolving power, and steppers were developed, which use for the light source an excimer laser serving as a high output laser oscillating in the ultraviolet region. Concomitantly to this, fluorite ($CaF_2$, calcium fluoride) has been drawing attention as a lens material suitable thereto. A fluorite is characterized by the transmittance being high for light beams in a wavelength region called vacuum ultraviolet region, such as from a KrF laser (wavelength: 248 nm) or an ArF laser (wavelength: 193 nm), among the excimer laser beams.

However, although it is necessary for these lens materials used in such high precision steppers to be homogeneous fluorites, in which there are little dislocations and sub-boundary structures, preparing such fluorites is not straightforward.

This species of fluorites is generally produced by growing a $CaF_2$ crystal by a single crystal growth method such as the Bridgman method and then heat-treating (also referred to as annealing) the obtained $CaF_2$ crystal. Heat-treating the $CaF_2$ crystal obtained in the crystal growth step allows the residual stress introduced during crystal growth to be eliminated, allowing residual distortions (strain birefringence) within the $CaF_2$ crystal to be reduced. Accordingly, the heat-treatment step is particularly important in order to produce a fluorite provided with optical characteristics of such high degree as described above.

Thus, when fluorite production techniques are examined by focusing on the heat-treatment step, the heat-treatment method in prior art is in general a method whereby a $CaF_2$ crystal obtained in the crystal growth step is disposed inside the heat-treatment oven, the temperature inside the oven is raised to a predetermined heat-treatment temperature, after the heat-treatment temperature has been reached, the temperature is controlled precisely to maintain the heat-treatment temperature for a given time in order to reduce/suppress as much as possible the temperature distribution (temperature difference) within the crystal, and then slowly cooled.

For instance, a method is described in Patent Document 1, in which a fluorite single crystal is retained for a given time at a first temperature (1,080° C.) in the range of 1,020° C. to 1,150° C., then, lowering in temperature from the first temperature (1,080° C.) to a second temperature (700° C. or lower) at a cooling rate of 1.0 (° C./h) or less; a method is described in Patent Document 2, in which a fluoride single crystal that has been crystal-extended is introduced into an annealing oven and heated for 20 hours or more by heating a crucible to 900 to 1,000° C.; and a method is described in Patent Document 3, in which the interior of a heat-treatment oven is turned into a vacuum atmosphere, retained at 1,000° C. for 24 hours for heat-treatment and then cooled.

In addition, a method is described in Patent Document 5, in which a single crystal base material is placed inside an ampule in an enveloped state with an external envelope fixture for heat-treatment comprising a material of the same species as the single crystal base material to carry out heat-treatment by heating from the exterior of the ampule thereby heating by containing with a material of the same species the outer periphery of the single crystal base material thereby suppressing a material alteration of the outer periphery of the single crystal base material.

Described in Patent Document 6 as a heat-treatment apparatus of fluorite single crystal is a heat-treatment apparatus of a constitution in which a temperature uniformizing member comprising a fluorite or the like having identical physical properties to the fluorite to be heat-treated is disposed in the periphery of the fluorite single crystal.

Furthermore, in Patent Document 7, a method is proposed as a heat-treatment method for a crystal-extended fluoride single crystal, in which the temperature inside the oven is raised to be within a range of 1,000 to 1,350° C., then, a rise-drop cycle in which a temperature drop and a temperature rise are carried out alternately in a temperature region of 900 to 1,350° C. is performed at least twice, followed by cooling, along with a method being described, in which, as an example of heat-treatment oven, a plurality of carbon vessels 54 are disposed inside an airtight oven 51 so as to be stacked vertically, and a $CaF_2$ crystal substrate 55 is housed inside each of these carbon vessels 54, as shown in FIG. 19.

PRIOR ART REFERENCES

Patent Documents

[Patent Document 1] Japanese Patent Application Laid-open No. 2001-335398.
[Patent Document 2] Japanese Patent Application Laid-open No. 2003-238293.
[Patent Document 3] Japanese Patent Application Laid-open No. 2004-99409.
[Patent Document 4] Japanese Patent Application Laid-open No. 2004-99409.
[Patent Document 5] Japanese Patent Application Laid-open No. S63-218600.
[Patent Document 6] Japanese Patent Application Laid-open No. H11-116400.
[Patent Document 7] Japanese Patent Application Laid-open No. 2008-156165.

Meanwhile, lens materials for an excimer laser sometimes sustain so-called photodamages, in which a color center is formed within the material while being irradiated by a light beam such as from a laser, provoking a local change in refractive index due to a decrease in transmittance or absorption heating. Furthermore, when irradiated by a strong laser beam, not only the photodamages described above, but also destruction due to heat stress induced by absorption heating, or, damages due to insulation destruction, or the like, by the strong photoelectric field from the laser beam, are sometimes sustained, such that laser durability is one important evaluation item in this species of optical materials.

And thus, the present invention proposes a novel method, which, by devising a heat-treatment method for $CaF_2$ crystal, allows a fluorite with excellent laser durability to be produced.

SUMMARY OF THE INVENTION

The present invention proposes a fluorite production method in which heat-treatment is carried out by providing, through compartment walls in the periphery of a fluorite crystal, a fluoride gas trap layer containing a fluoride gas-adsorbing material.

As a result of studying the causes for the occurrence of dislocations and sub-boundary structures in a fluorite crystal, it has become clear that, a high-temperature $F_2$ gas inside the heat-treatment oven reacts with a constitutive material of the wall surfaces of the heat-treatment oven, whereby a constitutive element (for instance, Cr, Fe, Ni, Mn and the like) of the material (for instance stainless) that constitutes the wall surface becomes fluoridized, generating a fluoride gas of transition metal inside the oven, and this fluoride gas of transition metal is one cause that promotes the extension of dislocations and sub-boundary structures, by attaching to the surface of the fluorite crystal and diffusing inside the crystal.

Thus, in the present invention, when a fluoride gas trap layer containing a fluoride gas-adsorbing material is provided through compartment walls in the periphery of the fluorite crystal to be heat-treated so as to trap with the fluoride gas trap layer the fluoride gas of transition metal generated from the wall surfaces of the heat-treatment oven, and the like, a homogenous fluorite crystal, in which there are little dislocations and sub-boundary structures, having excellent laser durability was obtained successfully.

Thus, the fluorite obtained by the production method of the present invention can be used suitably as, for instance, a TV camera lens, a microscope lens, a window material for infrared analysis, a lens material such as a lens used in semiconductor lithography devices, in particular, a lens material for a stepper of an exposure apparatus, or the like, using as a light source a laser in the ultraviolet or the vacuum ultraviolet wavelength region, such as an ArF (argon fluoride) excimer laser or an $F_2$ (fluorine) excimer laser exposure apparatus.

DETAILED DESCRIPTION OF THE INVENTION

Figure 1:
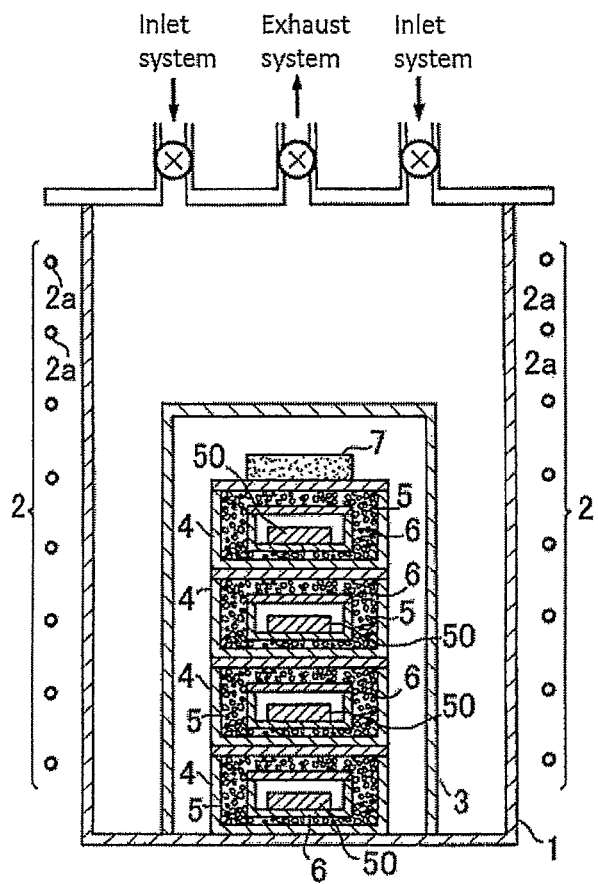
FIG. 1 Cross-sectional view showing an example of heat-treatment oven used in the present invention.

Hereinafter, embodiments of the present invention will be described in detail; however, the scope of the present invention is not limited to the embodiments described below.

The fluorite production method according to the present embodiment (hereinafter, this production method is referred to as "the present production method") is a method whereby a fluorite is produced through a crystal growth step for growing a $CaF_2$ crystal and a heat-treatment step for heat-treating the grown $CaF_2$ crystal.

Unless explicitly specified otherwise, the processing temperature in the crystal growth step and the heat-treatment step indicates the atmospheric temperature inside the oven.

<Raw Materials>

In the present production method, the raw materials for calcium fluoride ($CaF_2$) are not limited in particular, and all materials known as raw materials for $CaF_2$ can be used. As one example, $CaF_2$ raw materials in powder form, or a mixture of this and a scavenger or a fluorinated agent, that is to say, a reactive material for removing impurities inside the fluorite (mainly oxygen) can be cited.

Well-known $CaF_2$ raw materials can be used as the $CaF_2$ raw materials. To produce a $CaF_2$ crystal used in the ultraviolet or vacuum ultraviolet region, it is desirable to use a highly pure $CaF_2$ powder synthesized artificially as raw materials. For instance, a $CaF_2$ raw material powder in powder form obtained by reacting calcium carbonate and hydrogen fluoride can be cited.

In addition, as the scavenger or the fluorinated agent, zinc fluoride ($ZnF_2$), lead fluoride ($PbF_2$), bismuth fluoride ($BiF_3$), sodium fluoride (NaF), lithium fluoride (LiF), and the like, can be cited.

<Crystal Growth Step>

In the present production method, the crystal growth method for the $CaF_2$ crystal is not limited in particular. Well-known crystal growth methods can be adopted, such as, for instance, Bridgman-Stockbarger method (also referred to as "BS method"), Czochralski (also referred to as "CZ method"), zone melt method, improved methods thereof, and other melt-growth method.

The BS method is a method in which raw materials are introduced into a crucible and melted, and a single crystal is grown from the bottom of the crucible, while pulling the crucible downward. This has the characteristic that the crystal growth apparatus is relatively inexpensive and allows a single crystal of large diameter to be grown relatively easily. Conversely, control of the crystal growth direction is difficult and in addition, it is told that, as unreasonable stress is sustained at crystal growth or cooling, stress distribution remains inside the crystal, distortion and dislocation are easily induced. Since such distortion and dislocation remaining inside the crystal can be alleviated according to the present invention, it can be stated that the BS method is a crystal growth method that can benefit all the more from the effects of the heat-treatment step of the present invention.

Meanwhile, the CZ method is a method in which raw materials are introduced into a crucible and melted, a seed (seed crystal) is brought into contact with the molten liquid surface, and a single crystal is grown (crystallized) by rotating and pulling upward. As the CZ method allows for crystallization by specifying the crystal direction, growth in the targeted crystal direction is said to be straightforward.

Describing more specifically an example of crystal growth method, a crucible filled with raw materials and a scavenger is installed inside a crystal growth apparatus, evacuation is performed with a vacuum exhaust system until the degree of vacuum inside the crystal growth apparatus reaches on the order of $1\times10^{-3}$ to $10^{-4}$ Pa, and the crucible is heated with a heater to melt the raw materials filled into the crucible. Here, since gas adsorbed on the raw materials, gas reacted with the scavenger and gas adsorbed on the vacuum melt oven interior and crucible, and the like, desorb concomitantly to the rise in temperature of the crucible, it is necessary to continue performing vacuum evacuation and maintain the desired degree of vacuum during the crystal growth.

After the raw materials inside the crucible are melted, when the crucible is lowered vertically downward gradually at a speed of on the order of 0.1 mm/h to 3 mm/h, the raw materials, which as become a melt inside the crucible, are solidified from near the bottom portion, and a crystal is grown. At the stage where the entirety of the melt inside the crucible has solidified, the lowering of the crucible is terminated, and while slowly cooling with a heater, the crucible is cooled to about room temperature, allowing a $CaF_2$ crystal in ingot form to be grown.

The $CaF_2$ crystal in ingot form grown in this way is preferably cut out, as necessary into a given size, as well as, such that the surface in a given direction appears, and subjected to a heat-treatment step. For instance, cutting into a disk-shape of on the order of 200 mm in diameter and on the order of 40 mm in thickness and subjecting it to a heat-treatment step is possible.

<Heat-Treatment Step>

In the heat-treatment step, the $CaF_2$ crystal obtained in the crystal growth step is heat-treated, for instance as shown in FIG. 1. That is to say, heat-treating by providing, through compartment walls in the periphery of the $CaF_2$ crystal 50 to be heat-treated, a fluoride gas trap layer 5 having a fluoride gas-adsorbing material, is sufficient.

In FIG. 1, numeral 1 is a vacuum vessel, numeral 2 is a heater, numeral 3 is an annealing case, numeral 4 is a support vessel, numeral 5 is a fluoride gas trap layer, numeral 6 is a compartment-walled vessel, numeral 7 is a scavenger or a fluoridated agent, and numeral 50 is a $CaF_2$ crystal.

This heat-treatment oven is surrounded by a vacuum vessel 1 that may retain the interior in an airtight state, and is constituted in a way that allows the atmosphere inside the vacuum vessel 1 to be adjusted to a predetermined state as well as the temperature inside the vacuum vessel 1 to be controlled with high accuracy according to a determined temperature profile.

To adjust the atmosphere of the vacuum vessel 1 to a predetermined state, for instance, it is adequate to adjust the atmosphere by evacuating the gas inside the vacuum vessel 1 with an exhaust system and introducing a predetermined gas in suitable amounts with an inlet system.

In addition, to control the temperature of the vacuum vessel 1 with high accuracy according to a determined temperature profile, it is adequate, for instance, to install temperature sensors at suitable heights near the external walls of a support member installed inside the vacuum vessel 1, for instance, at each height among an upper layer portion, a middle layer portion and a lower layer portion, and controlling with these temperature sensors and a temperature controller the temperatures of a plurality of heaters 2a, 2a ... disposed along the side walls of the vacuum vessel 1.

The vacuum vessel 1 is formed from stainless or the like, inside of which is installed an annealing case 3.

The annealing case 3 is a vessel that fills a role for the purpose of supporting the support vessel 4 for retaining or supporting the heat-treatment subject, that is to say, the $CaF_2$ crystal, and can be formed from a carbon material. In addition, it is also a vessel that fills a role for the purpose of distributing the surrounding temperature of the support vessel 4 into an even heat.

A plurality of support vessels 4 which are stacked from top to bottom are housed inside this annealing case.

The support vessel 4 is a vessel that fills a role for the purpose of supporting the $CaF_2$ crystal, which is the heat-treatment subject, comprising, for instance, a box-shaped vessel main body comprising an opening in the upper direction and a lid body, and having a constitution allowing for stacking from top to bottom.

A respective compartment-walled vessel 6 is housed inside each support vessel 4, a respective $CaF_2$ crystal 50 is housed inside each compartment-walled vessel 6, and a fluoride gas trap layer 5 is formed between each compartment-walled vessel 6 and each support vessel 4.

The support vessel 4 can be formed from general carbon materials such as, for instance, extrusion-molded articles or CIP-molded articles of carbon.

The compartment-walled vessel 6 is a vessel that fills a role for the purpose of separation so that the $CaF_2$ crystal 50 does not come directly into contact with the fluoride gas trap layer 5, comprises, for instance, a box-shaped vessel main body comprising an opening in the upper direction and a lid body, and can be formed from general carbon materials such as, for instance, extrusion-molded articles or CIP-molded articles of carbon.

If the $CaF_2$ crystal 50 and the fluoride gas trap layer 5 enter into contact, not only the fluoride gas-adsorbing material adheres onto the surface of the $CaF_2$ crystal 50 during the heat-treatment, compromising the optical properties of the $CaF_2$ crystal 50, but a grain boundary structure of the crystal surface in contact also develops, compromising the optical properties; therefore, separating the two parties is important.

Figure 2:
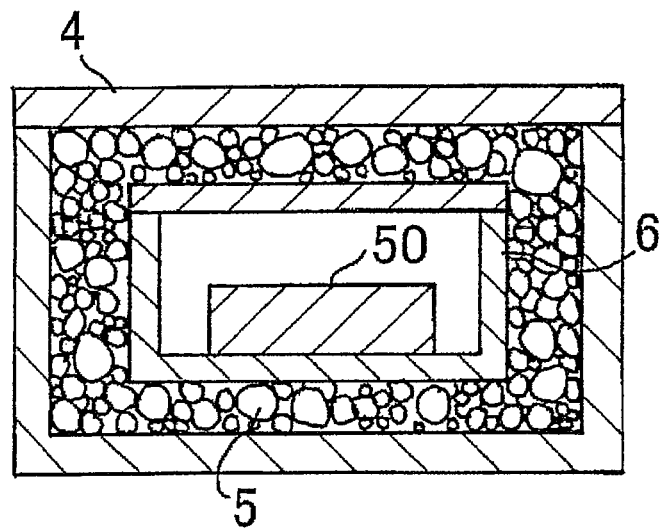
FIG. 2 Magnified cross-sectional view of relevant portion showing each compartment-walled vessel magnified centered thereon in FIG. 1.

The fluoride gas trap layer 5 can be formed by filling the fluoride gas-adsorbing material between the compartment-walled vessel 6 and the support vessel 4, so as to surround the entire periphery of the compartment-walled vessel 6, as shown in FIG. 2.

From the point of view of chemical reactions, it is desirable that the fluoride gas-adsorbing material is a material capable of adsorbing effectively a fluoride gas of a transition metal such as, for instance, Cr, Fe, Ni and Mn, and is one having a vapor pressure that is equal to or lower than that of the scavenger $PbF_2$. Among these, those whereof the vapor pressure is equal to or lower than that of $CaF_2$ are desirable. Concretely, to be powders, debris and grounds of a fluoride, for instance, powders, debris or grounds of a fluoride of Ca, or, powders, debris or ground powders of a fluoride of an element of the same family as Ca, for instance, an alkaline-earth element such as Mg, Sr or Ba, or, a mixture of two or more species thereof, is desirable. Among these, to be either of powders, debris and grounds of a fluoride of Ca, or a mixture of two or more species thereof, is more desirable.

From the point of view of gas trapping ability, the fluoride gas-adsorbing material is preferably a mixture with dispersed sizes so as to allow for fine filling.

In addition, from the point of view of fluorination treatment of the surface inside the annealing case 3, or of the fluoride gas-adsorbing material, or the like, the fluoride gas trap layer 5 can also be formed from a mixture of the fluoride gas-adsorbing material and the scavenger.

In so doing, in particular powders or debris of metal fluorides, among which in particular powders or debris of lead fluoride, are all the more desirable as the scavengers to be used.

From the point of view that a fluoride gas can be adsorbed effectively, the thickness of the fluoride gas trap layer 5 is preferably 5 mm to 200 mm, in particular 10 mm to 100 mm, of which in particular 20 mm to 50 mm is more desirable.

While it is desirable for the fluoride gas trap layer 5 to be formed so as to surround the entirety of the periphery of the compartment-walled vessel 6, it may be formed so as to surround a portion thereof.

In addition, the fluoride gas trap layer 5 may be formed into a plurality of layers.

It is adequate that the atmosphere in the heat-treatment, that is to say, the atmosphere inside the annealing case 3, is a vacuum atmosphere or an inert gas atmosphere such as of argon (Ar). Among them, inert gas atmospheres such as of argon, and among these, atmospheres comprising a fluorine gas mixed with/injected into argon gas, are desirable. In addition, a gas atmosphere, in which a fluorine gas from a thermal decomposition of solid fluorinated agent (for instance PbF2) is mixed in an inert gas such as argon, is also a desirable example.

In addition, as shown in FIG. 1, housing a fluorinated agent inside the annealing case 3 is desirable.

It is possible to use as fluorinated agent, for instance, Teflon (registered trademark), acidic ammonium fluoride ($NH_4F.HF$) or the like, or, lead fluoride, zinc fluoride or the like, or, a substance whereof the fluorine constituent can be gasified by raising the temperature.

While this fluorinated agent is one that is used in order to prevent oxygen and moisture remaining on the surface of the $CaF_2$ crystal 50 or inside the compartment-walled vessel 6 from reacting with the $CaF_2$ crystal 50, the use is not absolutely needed.

The temperature profile in the heat-treatment step is not limited in particular. Since the melting point of calcium fluoride is on the order of 1,370° C. to 1,410° C., heating to a temperature where the $CaF_2$ crystal 50 does not dissolve and maintains the state of a solid while each atom constituting the $CaF_2$ crystal 50 is given sufficient energy to be moved to a suitable position respectively to cancel an anisotropy due to a disturbance of the crystal structure is adequate, and this temperature region is not limited in particular. As a guide, in order to cancel more effectively an anisotropy due to a disturbance of the crystal structure, raising the temperature to 1,000 to 1,350° C. is desirable.

While the rate of rise in temperature is not limited in particular, as there is the necessity of raising the temperature inside the oven so that the $CaF_2$ crystal 50 housed inside the compartment-walled vessel 6 does not generate damages such as a crack due to a thermal shock, raising the temperature for instance at 10° C./h to 200° C./h is desirable.

In so doing, first, the temperature inside the oven may be raised to a predetermined target temperature of temperature rise (temperature rise step), then performing at least twice a rise-drop cycle in which temperature dropping and temperature rising are carried out alternately in the predetermined heat-treatment temperature region (rise-drop cycle step) and thereafter transitioning to a cooling step.

In the cooling step after the heat-treatment, taking time and cooling slowly is desirable, since distortions are likely to remain inside the crystal, and in addition, sliding defects are introduced, increasing dislocation or the like, if cooling rapidly. On the other hand, productivity is noticeably lost if too much time is spent. From such points of view, in the cooling step after the heat-treatment, cooling to near room temperature at a cooling rate of, for instance, 0.5 to 1.5° C./h, is desirable.

Then, finally, it suffices that the $CaF_2$ crystal 50 after heat-treatment is cut and processed as necessary into a suitable shape. For instance, processing into a shape having as a surface a plane that is parallel to the (111) plane is sufficient. As a more concrete example, the method of cutting a $CaF_2$ crystal 50 presenting a disk shape into a shape having a surface that is parallel to the (111) plane, further surface-grinding the surface for the purpose of smoothing the surface can be cited.

<Application>

According to the present production method described above, homogenization can be carried out by reducing dislocations and sub-boundary structures in a fluorite crystal, allowing a novel fluorite having excellent laser durability (referred to as "the present fluorite") to be produced.

Thus, the present fluorite can be used as, for instance, an apochromatic lens (apochromat), a TV camera lens, a microscope lens, a window material for infrared analysis, a lens used in semiconductor lithography (stepper and scanner) devices, or other optical lens. In particular, since a fluorite in which the homogeneity of the crystal is macroscopically high, and having excellent laser durability can be obtained, it can be used suitably as a lens material for a high precision stepper, that is to say, a stepper of an exposure apparatus, or the like, using as a light source a laser in the ultraviolet or the vacuum ultraviolet wavelength region such as an ArF (argon fluoride) excimer laser. In addition, having excellent laser durability, the present fluorite can be used suitably as a window material of a laser beam source of ultraviolet or vacuum ultraviolet wavelength region such as of an ArF excimer laser, or an optical element such as of a resonator mirror.

<Explanation of the Terms>

In the present invention, when "X to Y" (X and Y are any numbers) is stated, unless specified otherwise, it is to include the meaning of "X or greater but Y or less" along with the meaning of "preferably larger than X" or "preferably smaller than Y".

In addition, when "X or greater" (X is any number) is stated, unless specified otherwise, it is to include the meaning of "preferably larger than X", and when "Y or less" (Y is any number) is stated, unless specified otherwise, it is to include the meaning of "preferably smaller than Y".

EXAMPLES

Hereinafter, examples and comparative examples according to the present invention will be described. However, the present invention is not limited to the contents described below.

First, evaluation methods for the obtained fluorite will be described.

<Evaluation Method for Laser Durability>

Regarding the laser durability measured as a decrease in transmittance when irradiating ArF excimer laser onto a fluorite, in the present invention, it was decided to evaluate the laser durability by observing the decrease in transmittance induced when irradiating a radiation from a higher energy radiation source, that is to say, the absorption of the induced color center.

Consequently, in the present invention, γ-rays (1.17 MeV and 1.33 MeV) emitted from the radioisotope $^{60}$Co was irradiated in predetermined doses onto a radiation source, the color center induced at that moment inside the crystal was measured with a spectrophotometer to obtain an induced color center absorption spectrum. A negative correlation is known to exist for the relationship between laser durability and γ-ray-induced color center absorption intensity. That is to say, in a crystal with high laser durability, the γ-ray-induced color center absorption intensity is small. The laser durability of the present fluorite can be evaluated from this correlation relationship.

Concretely, both end faces of a fluorite sample were optical polished so that the planes became parallel, and the optical length (sample thickness) was set to be 30 mm. Such a fluorite sample was retained inside a dark box, and a dose of 5.4 kGy γ-ray (1.17 MeV, 1.33 MeV) from 60Co was irradiated in air to induce a color center in the sample. Next, after irradiation, a recording spectrophotometer (U-4100, Hitachi High Technologies) was used rapidly to measure the absorption spectrum of this fluorite sample in the UV-visible wavelength region (200 nm to 800 nm).

By "absorption" here, the so-called absorption coefficient (value obtained by taking the natural logarithm of transmittance corrected for the reflections of the end faces and normalizing with the length according to the Lambert-Beer's Law; the unit is $cm^{-1}$) was adopted.

In addition, in order to quantify the induced color center absorption intensity, the value obtained by integrating the obtained absorption spectrum in an interval from 200 nm to 800 nm wavelength was used. This integration value is defined as the γ-ray-induced color center intensity. That is to say, if the laser durability is low (high), the induced absorption spectrum integration value becomes large (small).

<Evaluation Method for Etch-Pits>

In the present example, with respect to the etch-pit distribution in the $CaF_2$ crystal, the Voronoi surface areas and the Delaunay distances described below were defined, the variations (standard deviations) thereof were calculated, whereby the dislocation distribution (etch-pit distribution) in the $CaF_2$ crystal was quantitatively evaluated.

(Calculation Methods for the Standard Deviations of Voronoi Surface Areas and Delaunay Distances)

1) In order to obtain a clean surface of $CaF_2$ crystal, it was cleaved or precision polished in the (111) plane.

Here, the reason for having the $CaF_2$ (111) plane as the etching surface is that a flat surface (that is to say a surface of cleavage) can be obtained easily. In addition, the obtained etch-pit is characterized by the fact that a pit with a trigonal pyramidal shape constituted by other (111) planes is obtained.

2) Etching of 25° C.×1 hour was performed by immersion in an etchant (7% HCl solution).

3) The etched surface (4 mm in four directions) was photographed with a light microscope, and the image was digitized.

4) Based on the etch-pit image digitized in this way, the etch-pits and portions other than these were processed by binarization (Background removal, threshold value setting). In addition, dust and scratches other than the etch-pits were eliminated. In addition, adjacent, overlapping etch-pits were separated manually and by watershed segmentation.

5) If etch-pits were regularly arranged and adjacent in sub-boundaries or grain boundaries and there were overlaps, each etch-pit was separated based on an average neighboring distance. Concretely, the separation was done by generating a mesh (Grid) against an etch-pit group that had been binarized and recognized as a line.

6) For the etch-pit images adjusted in this way (refer to FIG. 7, FIG. 10, FIG. 13 and FIG. 16), Delaunay decomposition and Voronoi decomposition were performed using an image processing soft (freeware: ImageJ). That is to say, for the entirety of the etch-pits within the effective field of view, the center-of-gravity point thereof was determined and served as a generatrix, and with respect to the entirety of the generatrixes in the image, domain-separation (Voronoi decomposition) was carried out depending on which generatrixes the other generatrixes were close to and it is served as a Voronoi diagram (refer to FIG. 9, FIG. 12, FIG. 15 and FIG. 18), each polygonal-shape region that constitutes the Voronoi diagram is served as a Voronoi region and the border line separating each region is served as a Voronoi boundary. In addition, a diagram decomposed newly by linking together the entirety of the generatrixes (these are referred to as a "Delaunay point") contained in two Voronoi regions that are adjacent through the Voronoi boundary, served as a Delaunay diagram (or, Delaunay diagram; refer to FIG. 8, FIG. 11, FIG. 14 and FIG. 17).

Next, the surface area of a Voronoi region (Voronoi figure) in the Voronoi diagram within the effective field of view was defined and calculated as "Voronoi surface area", and the standard deviation was calculated by carrying out statistical processing to evaluate the variation in the Voronoi surface area.

In addition, the lengths of the edges of each figure (defined as the "Dealunay distances") in the Delaunay diagram (Dealunay decomposition) were calculated and the standard deviation of the Delaunay distances was determined by carrying out statistical processing to evaluate the variation.

Example 1

A $CaF_2$ crystal ingot grown by the Bridgman-Stockbarger method (BS method) was cut out in the <111> direction, processed into a disk shape with a size of approximately 80 mm diameter and approximately 30 mm thickness to obtain an as-grown crystal substrate.

In the following examples and comparative examples, the respective crystal substrates were collected from equivalent sites of an identical crystal ingot.

The crystal substrate obtained in this way was heat-treated using a heat-treatment oven with a constitution shown in FIG. 1 and subsequently cooled. Likewise for the following comparative examples.

In so doing, a ground powder of $CaF_2$ crystal (particle size distribution: 10 μm to 10 mm) serving as a fluoride gas-adsorbing material was filled between the compartment-walled vessel 6 and the support vessel 4 so as to surround the entire periphery of the compartment walled vessel 6 to form a 20 mm-thick fluoride gas trap layer 5.

In addition, as shown in FIG. 1, a $PbF_2$ powder was placed inside the annealing case 3 as a fluorinated agent.

The profile of the heat-treatment step was as follows.

First, at room temperature, the interior of the heat-treatment oven was reduced in pressure to have a vacuum atmosphere, and then, the atmosphere inside the oven was rapidly substituted to Ar gas atmosphere.

Thereafter, the temperature was raised up to the highest temperature of 1,100° C. with a temperature rise time of 36 hours with a heater, and then the temperature was maintained for 24 hours. Thereafter, cooling to room temperature took 10 days.

From the crystal substrate obtained by heat-treating in this way, a specimen (sample) for etch-pit observation was cut-out and cleaved in the (111) plane in order to obtain a clean surface for observation surface use.

In addition, a sample for the purpose of evaluating laser durability was cut-out and optical polishing was performed on both (111) plane end surfaces.

Example 2

A specimen (sample) was obtained in a similar manner to Example 1, except that, in the profile of the heat-treatment step of Example 1, the temperature was raised up to the highest temperature of 1,000° C. with a temperature rise time of 36 hours, and then the temperature was maintained for 24 hours.

Example 3

A specimen (sample) was obtained in a similar manner to Example 1, except that a mixture from a ground powder of $CaF_2$ crystal (particle size distribution: 10 μm to 10 mm) and a powder of lead fluoride (particle size: approximately 50 μm) mixed at a mass proportion of 99:1 was filled between the compartment-walled vessel 6 and the support vessel 4 so as to surround the entire periphery of the compartment-walled vessel 6 to form a 20 mm-thick fluoride gas trap layer 5.

Comparative Example 1

A specimen (sample) was obtained in a similar manner to Example 1, except that no ground powder of $CaF_2$ crystal was filled in Example 1.

Comparative Example 2

A specimen (sample) was obtained in a similar manner to Example 2, except that no ground powder of $CaF_2$ crystal was filled in Example 2

TABLE 1

| Specimen | Voronoi surface area standard deviation (μm$^2$) | Delaunay distance standard deviation (μm) | $^{60}$Co-γ-ray-induced color center absorption intensity (×10$^{-7}$) |
|---|---|---|---|
| Example 1 | 4312 | 66.7 | 2.45 |
| Example 2 | 1853 | 39.9 | 1.59 |
| Example 3 | 3818 | 67.3 | 3.16 |
| Comparative Example 1 | 6205 | 82.0 | 5.59 |
| Comparative Example 2 | 8003 | 92.7 | 6.13 |

Examples 4 to 8

Specimens (samples) were obtained in a similar manner to Example 1, except that, in the profile of the heat-treatment step of Example 1, the temperature was raised up to the highest temperatures of 950 to 1,200° C. with temperature rise times of 30 to 36 hours, and then the temperature was maintained for 24 hours.

Comparative Examples 3 to 5

Specimens (samples) were obtained in a similar manner to Comparative Example 1, except that, in the profile of the heat-treatment step of Comparative Example 1, the temperature was raised up to the highest temperatures of 950 to 1,200° C. with temperature rise times of 30 to 36 hours, and then the temperature was maintained for 24 hours.

(Discussion)

As a result of studying the causes for the occurrence of dislocations and sub-boundary structures in a fluorite crystal, it has become clear that, a high-temperature $F_2$ gas inside the heat-treatment oven reacts with the wall surfaces of the heat-treatment oven, whereby a constitutive element (for instance, Cr, Fe, Ni, Mn and the like) of the material (for instance stainless) that constitutes the wall surface becomes fluoridized generating a fluoride gas of transition metal inside the oven, and this transition metal fluoride gas is one cause that promotes the extension of dislocations and sub-boundary structures, by attaching to the surface of the fluorite crystal and diffusing inside the crystal.

Figure 3:
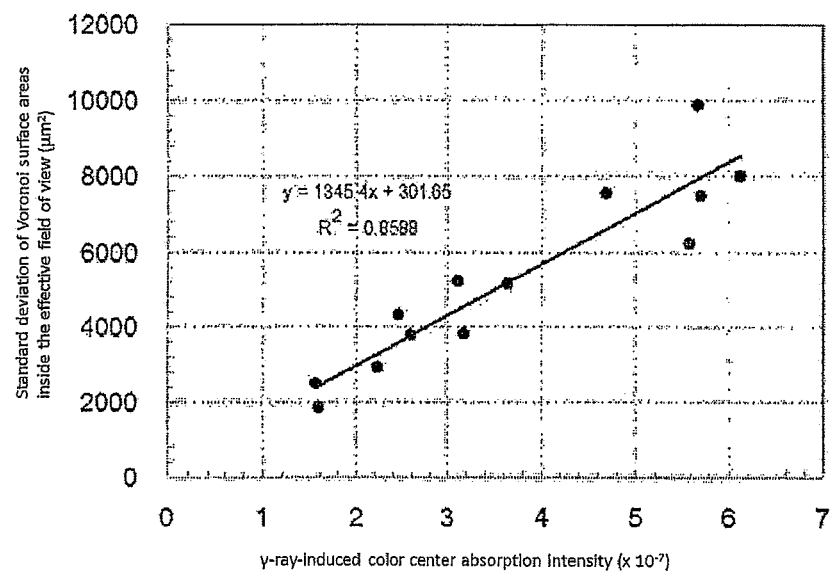
FIG. 3 Graph showing the relationship between the color center absorption intensity induced by γ-ray irradiation, which is an alternative property to laser durability, and the standard deviation of Voronoi surface areas for the samples obtained in Examples 1 to 8 and Comparative Examples 1 to 5.
Figure 4:
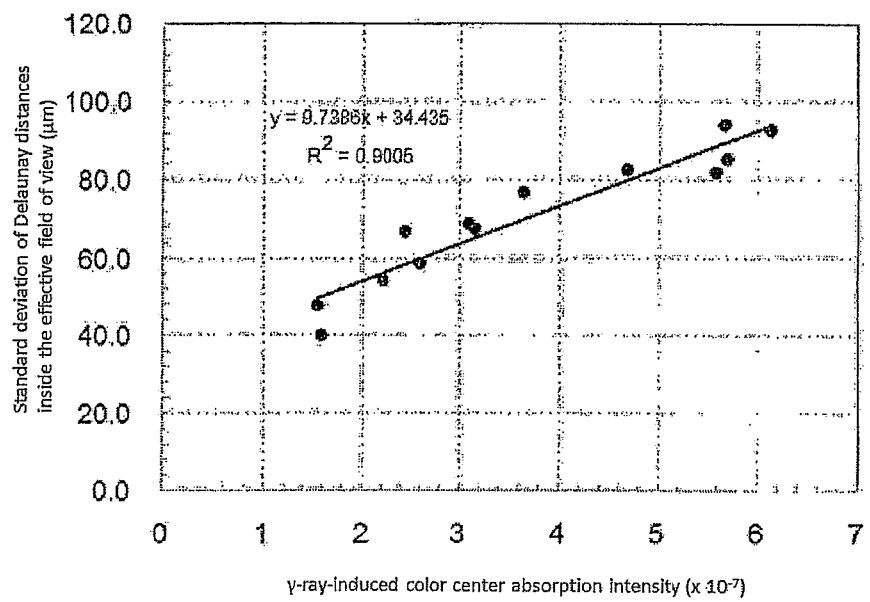
FIG. 4 Graph showing the relationship between the color center absorption intensity induced by γ-ray irradiation, which is an alternative property to laser durability, and the standard deviation of Delaunay distances for the samples obtained in Examples 1 to 8 and Comparative Examples 1 to 5.
Figure 5:
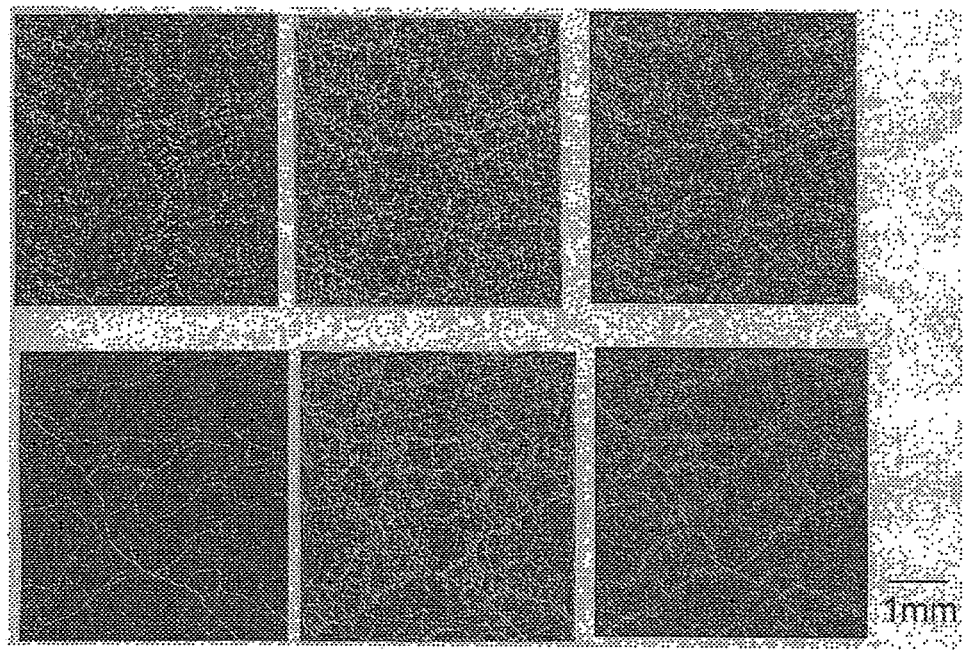
FIG. 5 View comparing the etch-pit images (Etch-pit observation images), the Delaunay diagrams and the Voronoi diagrams of the samples obtained in Example 1 and Comparative Example 1 aligned at the top and the bottom respectively.
Figure 6:
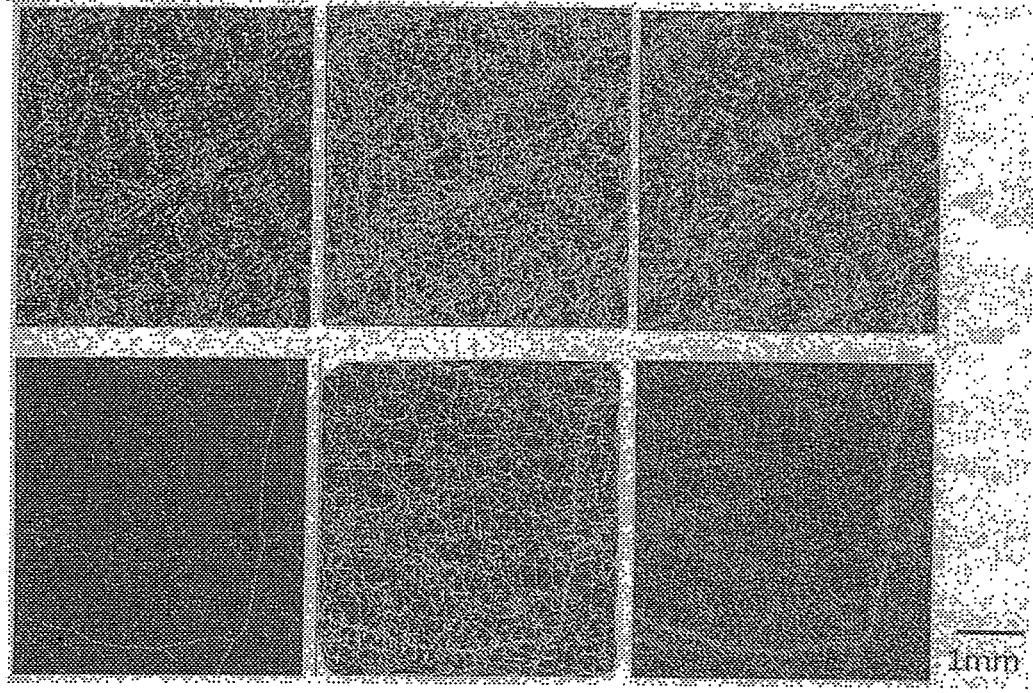
FIG. 6 View comparing the etch-pit images (Etch-pit observation images), the Delaunay diagrams and the Voronoi diagrams of the samples obtained in Example 2 and Comparative Example 2 aligned at the top and the bottom respectively.
Figure 7:
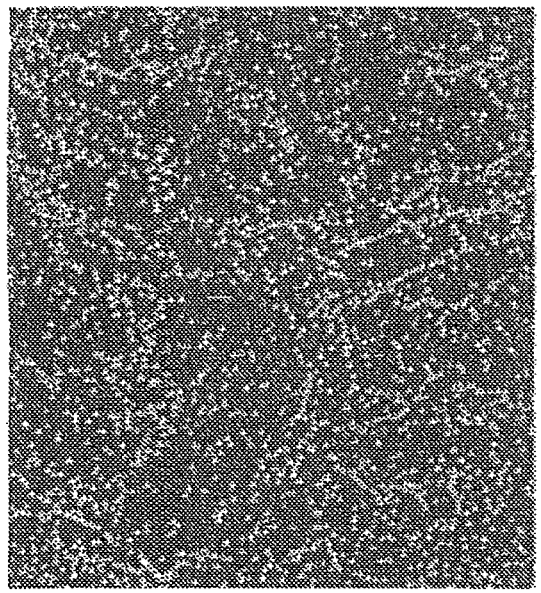
FIG. 7 Etch-pit image (Etch-pit observation image) of the sample obtained in Example 1.
Figure 8:
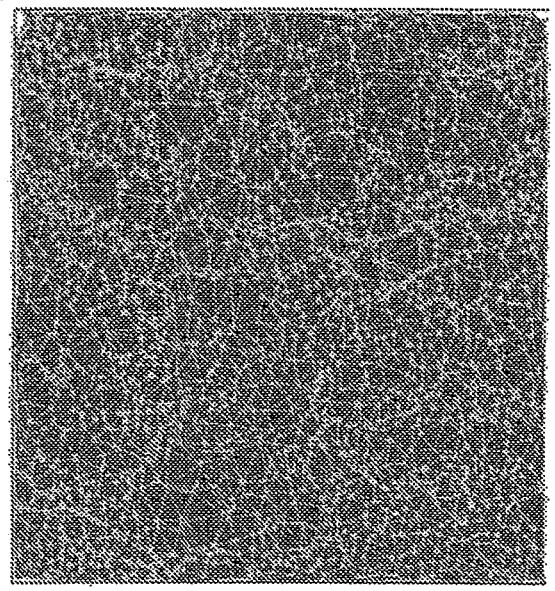
FIG. 8 Delaunay diagram of the sample obtained in Example 1.
Figure 9:
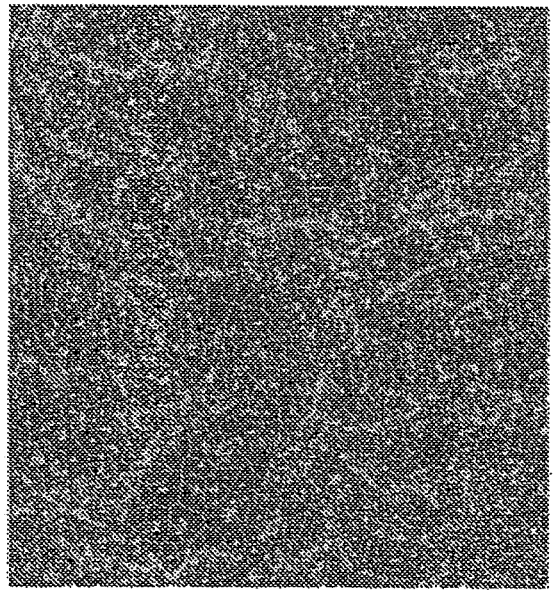
FIG. 9 Voronoi diagram of the sample obtained in Example 1.
Figure 10:
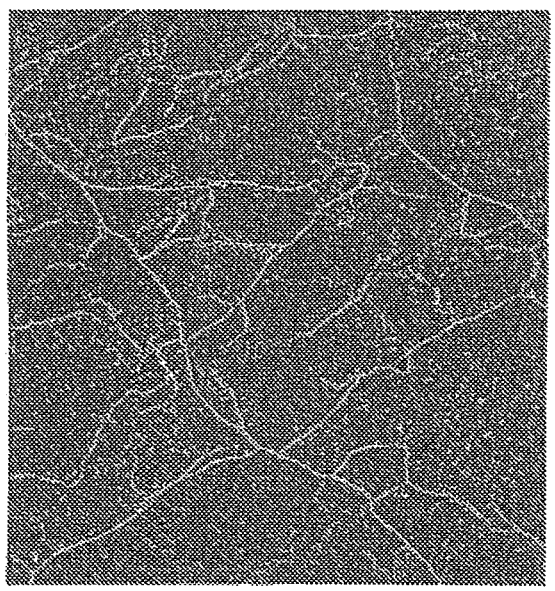
FIG. 10 Etch-pit image (Etch-pit observation image) of the sample obtained in Comparative Example 1.
Figure 11:
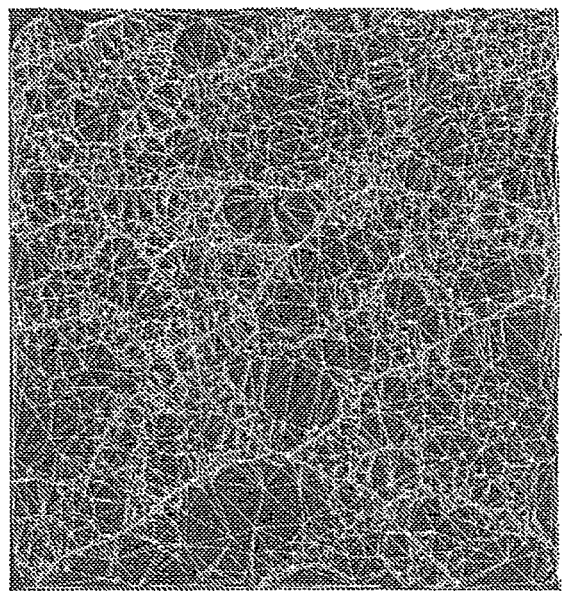
FIG. 11 Delaunay diagram of the sample obtained in Comparative Example 1.
Figure 12:
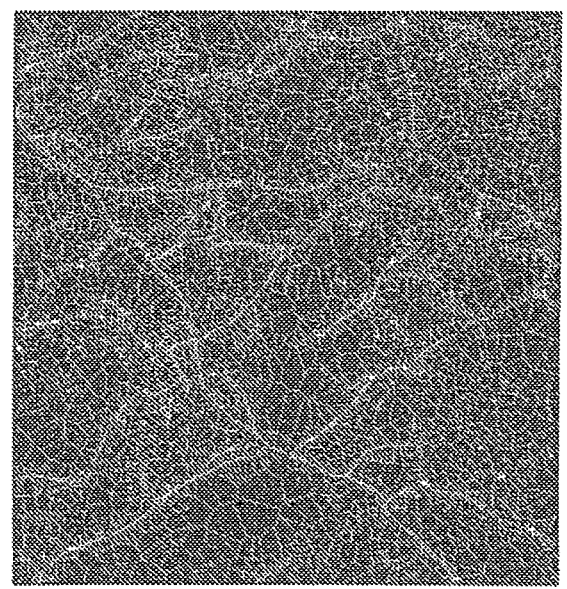
FIG. 12 Voronoi diagram of the sample obtained in Comparative Example 1.
Figure 13:
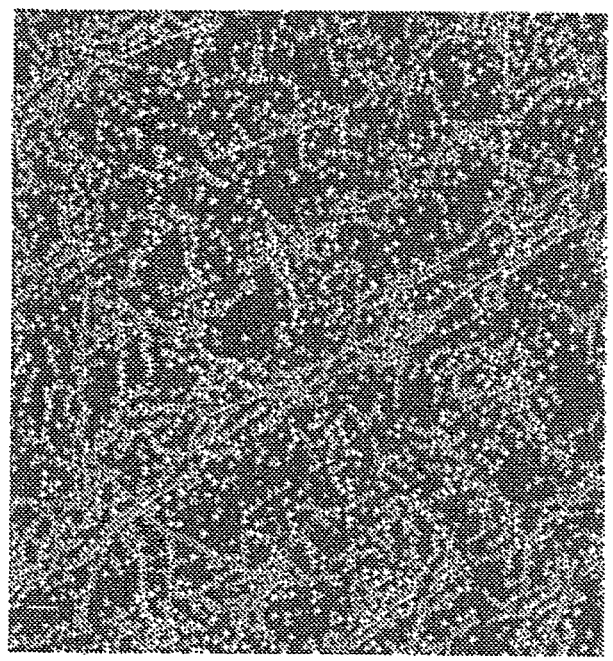
FIG. 13 Etch-pit image (Etch-pit observation image) of the sample obtained in Example 2.
Figure 14:
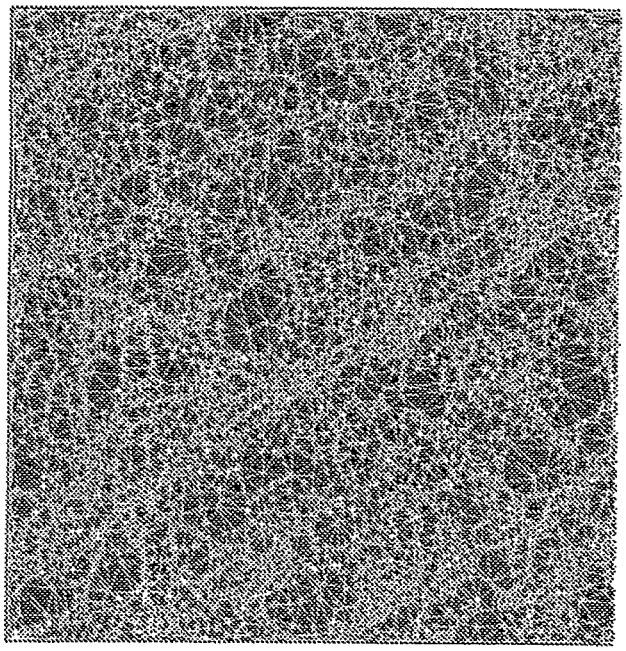
FIG. 14 Delaunay diagram of the sample obtained in Example 2.
Figure 15:
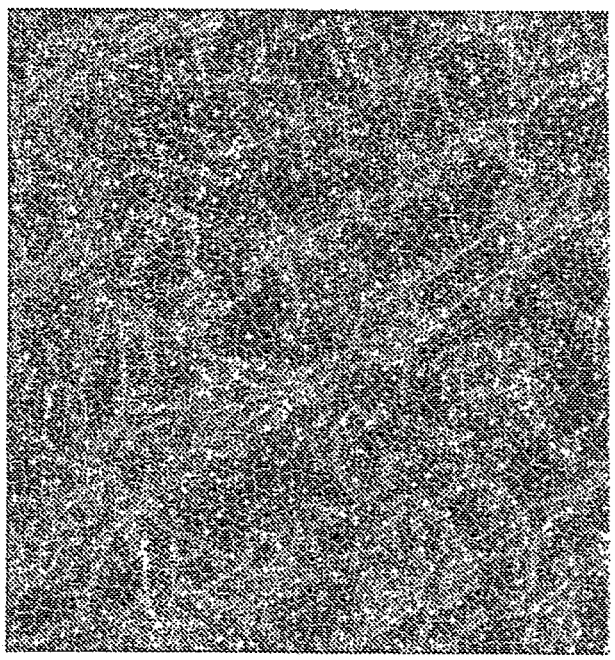
FIG. 15 Voronoi diagram of the sample obtained in Example 2.
Figure 16:
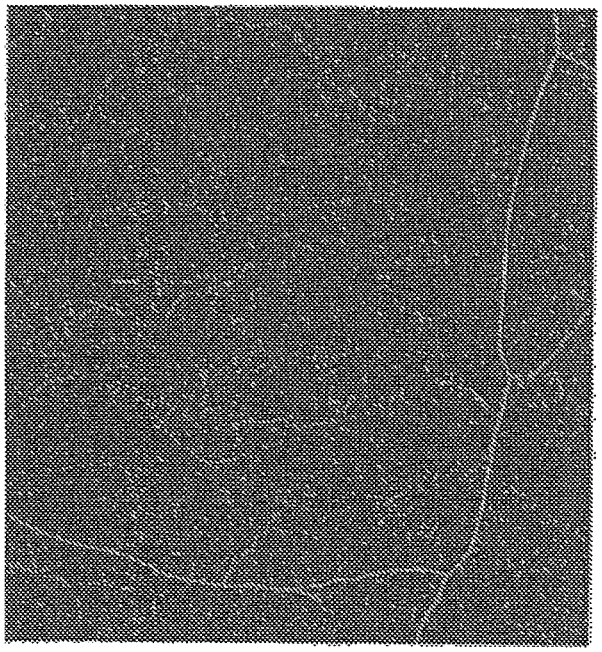
FIG. 16 Etch-pit image (Etch-pit observation image) of the sample obtained in Comparative Example 2.
Figure 17:
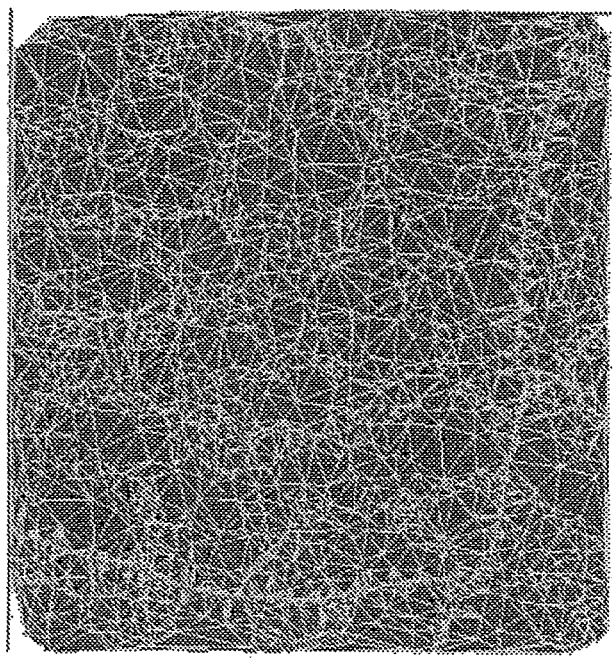
FIG. 17 Delaunay diagram of the sample obtained in Example 2.
Figure 18:
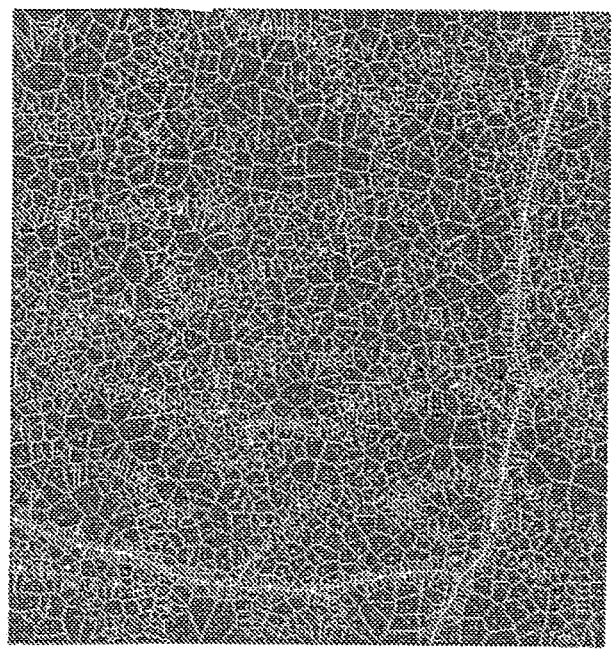
FIG. 18 Voronoi diagram of the sample obtained in Example 2.
Figure 19:
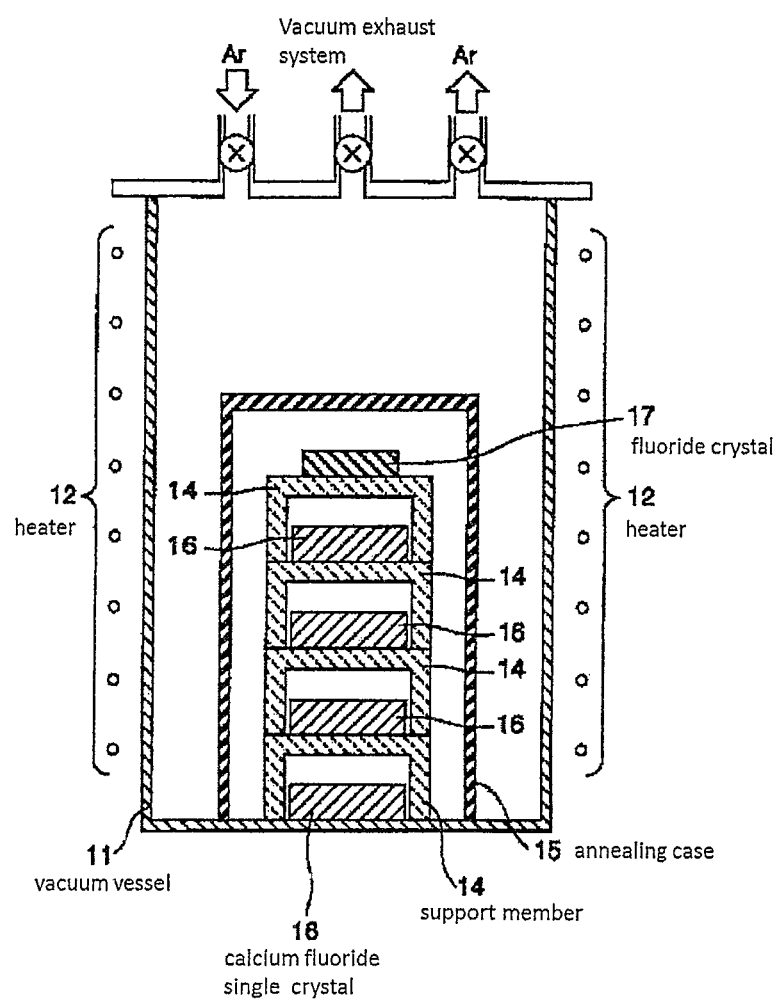
FIG. 19 Cross-sectional view showing an example of prior art heat-treatment oven.

Thus, in the present invention, when a fluoride gas trap layer containing a fluoride gas-adsorbing material is provided through compartment walls in the periphery of the fluorite crystal to be heat-treated so as to trap with the fluoride gas trap layer the fluoride gas of transition metal generated from the wall surfaces of the heat-treatment oven, and the like (Example), if the cases where heat-treatment was done by providing a fluoride gas trap layer through compartment walls in the periphery of the fluorite crystal (Examples) are compared to the cases where heat-treatment was done without providing a fluoride gas trap layer (Comparative Examples), they differ greatly regarding both the standard deviation of the Voronoi surface areas and the standard deviation of the Delaunay distances as shown in FIG. 3 and FIG. 4, and fluorite crystals having excellent laser durability were found to be obtained in the cases where heat-treatment was done by providing a fluoride gas trap layer.

While the examples use a powder of calcium fluoride as the fluoride gas-adsorbing material, since an equivalent effect to calcium fluoride can be expected if a material is one that is capable of absorbing effectively a fluoride gas of a transition metal such as, for instance, Cr, Fe, Ni or Mn, and the vapor pressure thereof is equal to [that of] the scavenger $PbF_2$ or lower, then, powders, debris and grounds of a fluoride of a transition metal element from the elements in the same family as Ca, such as, for instance, Mg, Sr and Ba, or a mixture of two or more species thereof, can be considered to be useful as a fluoride gas-adsorbing material.

In addition, it was found that desirable results were also obtained if, as in Example 3, the fluoride gas trap layer is formed from a mixture of a fluoride gas-adsorbing material and a powder or a debris of a metallic fluoride serving as a scavenger.

The invention claimed is:

1. A fluorite production method comprising,
   forming a fluorite crystal through a crystal growth step in a crystal growth apparatus,
   removing said fluorite crystal from said crystal growth apparatus,
   providing a compartment walled vessel,
   introducing said fluorite crystal within said compartment walled vessel, wherein a fluoride gas trap layer containing a fluoride gas-adsorbing material resides in a periphery around said compartment walled vessel, and
   subjecting said fluorite crystal to a heat-treatment step within said compartment walled vessel, wherein during said heat-treatment step, said fluorite crystal maintains the state of a solid.

2. The fluorite production method according to claim 1, wherein said fluoride gas-adsorbing material is a fluoride of a Group 2 alkaline earth metal, or a mixture of two or more species thereof, in a form of a powder, a debris, or grounds.

3. The fluorite production method according to claim 1, wherein the fluoride gas trap layer is formed from a mixture of a fluoride gas-adsorbing material and a powder or debris of a metal fluoride as the scavenger.

4. The fluorite production method according to claim 3, wherein a powder or debris of lead fluoride is used as the scavenger.

5. The fluorite production method according to claim 2, wherein the fluoride gas trap layer is formed from a mixture of a fluoride gas-adsorbing material and a powder or debris of a metal fluoride as the scavenger.

6. The fluorite production method according to claim 1, wherein said compartment walled vessel resides within a support vessel, and said fluoride gas trap layer containing said fluoride gas-adsorbing material resides between said compartment walled vessel and said support vessel.

7. The fluorite production method of according to claim 6, wherein said fluoride gas-adsorbing material is a fluoride of a Group 2 alkaline earth metal, or a mixture of two or more species thereof, in a form of a powder, a debris, or grounds.

8. The fluorite production method according to claim 1, wherein said compartment walled vessel is fabricated from carbon.

* * * * *